(12) United States Patent
Hayashi

(10) Patent No.: US 6,369,993 B1
(45) Date of Patent: Apr. 9, 2002

(54) MAGNETORESISTANCE EFFECT SENSOR AND MAGNETORESISTANCE DETECTION SYSTEM AND MAGNETIC STORAGE SYSTEM USING THIS SENSOR

(75) Inventor: Kazuhiko Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/544,608

(22) Filed: Apr. 6, 2000

Related U.S. Application Data (62) Division of application No. 09/075,832, filed on May 12, 1998.

(30) Foreign Application Priority Data

May 14, 1997 (JP) .............................................. 9-123797

(51) Int. Cl.⁷ ............................................ G11B 05/127
(52) U.S. Cl. ............... 360/327.2; 324/252; 324/207.21; 338/32 R
(58) Field of Search ................................. 360/317, 322, 360/324.11, 324.12, 327.32, 327.22, 327.23, 327.24, 327.2; 324/252, 207.21; 338/32 R (56) References Cited

U.S. PATENT DOCUMENTS

| | | | |
|---|---|---|---|
| 4,663,685 A | * | 5/1987 | Tsang ..................... 360/327.32 |
| 5,327,313 A | * | 7/1994 | Nishioka et al. ............ 360/113 |
| 5,436,778 A | * | 7/1995 | Lin et al. ................ 360/327.32 |
| 5,491,600 A | * | 2/1996 | Chen et al. .................. 360/113 |
| 5,552,949 A | * | 9/1996 | Hashimoto et al. ..... 360/327.32 |
| 5,557,492 A | * | 9/1996 | Gill et al. .................... 360/113 |
| 5,568,335 A | * | 10/1996 | Fontana et al. ............. 360/113 |
| 5,633,771 A | * | 5/1997 | Yoda et al. ............. 360/317 X |
| 5,668,686 A | * | 9/1997 | Shouji et al. ................ 360/113 |
| 5,717,550 A | * | 2/1998 | Nepela et al. .......... 360/327.32 |
| 5,761,010 A | * | 6/1998 | Mimura ................. 360/327.32 |
| 5,818,684 A | | 10/1998 | Iwasaki et al. |
| 5,828,530 A | | 10/1998 | Gill et al. |
| 5,874,886 A | | 2/1999 | Araki et al. |
| 5,883,764 A | * | 3/1999 | Pinarbasi ..................... 360/113 |
| 5,892,641 A | * | 4/1999 | Ishiwata ..................... 360/113 |
| 6,111,730 A | * | 8/2000 | Fernandez-de-Castro 360/327.1 |
| 6,133,732 A | * | 10/2000 | Hayashi ..................... 324/252 |

FOREIGN PATENT DOCUMENTS

| | | |
|---|---|---|
| JP | 2-61572 | 3/1990 |
| JP | 4-358310 | 12/1992 |
| JP | 6-203340 | 7/1994 |
| JP | 6-214837 | 8/1994 |
| JP | 7-136670 | 5/1995 |
| JP | 7-220292 | 8/1995 |
| JP | 7-262529 | 10/1995 |
| JP | 8-17631 | 1/1996 |
| JP | 8-127864 | 5/1996 |
| JP | 8-204253 | 8/1996 |
| JP | 9-50611 | 2/1997 |

OTHER PUBLICATIONS

David A. Thompson et al., "Thin Film Magnetoresistors in Memory, Storage, and Related Applications", IEEE Transactions on Magnetics, vol. MAG–11, No. 4, Jul. 1975.

\* cited by examiner

*Primary Examiner*—Brian E. Miller
(74) *Attorney, Agent, or Firm*—Young & Thompson (57) ABSTRACT

A shielded magnetoresistance (MR) effect sensor includes the following layers that are laminated in sequence: a lower shielding layer, a lower gap layer, a MR effect device, a vertical bias layer that directly contacts side surfaces of the MR effect device, and a lower electrode layer that also directly contacts the side surfaces of the MR effect device. An upper gap layer is laminated on the lower electrode layer and on a top surface of the MR effect device and an upper shielding layer is laminated on the upper gap layer. Alternatively, the vertical bias layer directly contacts the top and side surfaces of the MR effect device and the lower electrode is laminated on the vertical bias layer.

6 Claims, 8 Drawing Sheets

MAGNETORESISTANCE EFFECT SENSOR AND MAGNETORESISTANCE DETECTION SYSTEM AND MAGNETIC STORAGE SYSTEM USING THIS SENSOR

CROSS-REFERENCE TO RELATED APPLICATIONS

This application is a division of copending application Ser. No. 09/075,832, filed May 12, 1998.

BACKGROUND OF THE INVENTION

1. Field of the Invention

The present invention relates to a magnetoresistance effect device for reading an information signal recorded on a magnetic storage medium using a magnetoresistance effect sensor, and a magnetoresistance detection system and magnetic storage system.

2. Description of the Related Art

As prior art there is known a magnetoresistance (MR) sensor or a magnetic reading converter called an MR head. This has the characteristic feature that it can read data from the surface of a magnetic recording medium with high linear density. An MR sensor detects a magnetic field signal by means of resistance change as a function of intensity and direction of magnetic flux sensed by a reading device. Such a prior art MR sensor operates in accordance with the anisotropic magnetoresistance (AMR) effect whereby one component of the resistance of the reading device changes in proportion to the square of the cosine of the angle between the magnetisation direction and the direction of the sensing current that flows in the device.

A more detailed description of the AMR effect is given in the article "Memory, Storage and Related Applications" IEEE Trans. on Mag. MAG-11, P. 1039 (1975) by D. A. Thompson et al. (Magnetic recorder for storing magnetic data on this magnetic storage medium: Thompson). In a magnetic head using the AMR effect, a vertical bias is often applied in order to suppress Barkhausen noise. Antiferromagnetic materials such as FeMn, NiMn or nickel oxide are often used as materials to apply this vertical bias.

Furthermore, in recent years, a more pronounced magnetoresistance effect has been reported in which resistance change of a laminated magnetic sensor is caused by spin dependent transfer of conduction electrons between magnetic layers through a non-magnetic layer and by spin dependent scattering at the layer boundaries association with this. This magnetoresistance effect is called by various names such as the "giant magnetoresistance effect" or "spin valve effect". Such magnetoresistance sensors may be formed of suitable materials and show a larger resistance change with improved sensitivity compared with sensors in which the AMR effect is employed. In such MR sensors, the in-plane resistance between a pair of ferromagnetic layers separated by a non-magnetic layer changes in proportion to the cosine of the angle between the magnetisation directions of the two layers.

Early Japanese Patent Publication H. 2-61572 discloses a laminated magnetic structure for producing a high MR change generated by antiparallel alignment of magnetisation in magnetic layers. The examples given in this publication of materials that can be used in the laminated structure include ferromagnetic transition metals and alloys. Also, a construction is disclosed in which an antiferromagnetic layer is added to one of at least two ferromagnetic layers separated by an intermediate layer, and it is disclosed that FeMn is suitable as this antiferromagnetic layer.

Early Japanese Patent Publication H. 4-358310 discloses an MR sensor independent of direction of current flow through the sensor having two thin-film layers of ferromagnetic material partitioned by a thin-film layer of non-magnetic metal, wherein the direction of magnetisation of the two ferromagnetic thin-film layers are orthogonal in the case where the applied magnetic field is zero and the resistance between the two non-coupled ferromagnetic layers changes in proportion to the cosine of the angle between the magnetisation directions of the two layers.

Early Japanese Patent Publication H. 6-203340 discloses an MR sensor based on the above effect including two ferromagnetic thin-film layers that are separated by a thin-film layer of non-magnetic metallic material and wherein, when the externally applied magnetic field is zero, the magnetisation of an adjacent antiferromagnetic material layer is maintained perpendicular with respect to the other ferromagnetic material layers.

Early Japanese Patent Publication H. 7-262529 discloses a spin valve magnetoresistance effect device having a construction: first magnetic layer/non-magnetic layer/second magnetic layer/antiferromagnetic layer, using in particular CoZrNb, CoZrMo, FeSiAl, FeSi, or NiFe or material wherein Cr, Mn, Pt, Ni, Cu, Ag, Al, Ti, Fe, Co or Zn is added thereto is employed for the first magnetic layer and the second magnetic layer.

The invention disclosed in Early Japanese Publication H. 7-202292 consists in a plurality of magnetic thin films which are laminated with interposition of non-magnetic layers onto a substrate and wherein antiferromagnetic thin films are provided adjacently to one soft mutually adjacent magnetic thin film with interposition of a non-magnetic thin film.

This is a magnetoresistance effect film wherein, if the biasing magnetic field of this antiferromagnetic thin film is Hr and the coercive force of the other soft magnetic thin film is Hc2, Hc2<Hr and wherein the antiferromagnetic material consists of at least one of NiO, CoO, FeO, Fe2O3, MnO or Cr or a mixture of these.

Also, the invention disclosed in Japanese Patent Application H. 6-214837 and Japanese Patent Application H. 6-269524 consists in a magnetoresistance effect film as described above wherein the antiferromagnetic material is a superlattice selected from at least two of NiO, NixCo1−xO, and CoO.

Also, the invention disclosed in Japanese Patent Application H. 7-11354 consists in a magnetoresistance effect film as described above in which the antiferromagnetic material is a superlattice selected from at least two of NiO, $Ni_xCo_{1-x}O$ (x=0.1~0.9), or CoO and the atomic number ratio of Ni to Co in this superlattice is at least 1.0.

Also, in published Japanese Patent Application H. 7-136670 it is disclosed that a magnetoresistance effect film as described above is a two-layer film in which the antiferromagnetic material is obtained by lamination of 10 to 40 Å of CoO onto the antiferromagnetic NiO material. However, in the prior art, a magnetoresistance effect device having the basic structure: /magnetic layer/non-magnetic layer/magnetic layer/antiferromagnetic layer/ or /antiferromagnetic layer/magnetic layer/non-magnetic layer/magnetic layer is subject to the following problems. Specifically, by oxidation of the uppermost layer of the structure by annealing treatment at 200° C. or more, the exchange coupling magnetic field Hex or the rate of change of magnetoresistance (MR ratio) is lowered. With a magnetoresistance effect device of this type, an exchange coupling magnetic field is obtained that is applied to the fixed magnetic layer from the antiferromagnetic layer, so heat treatment at a temperature of 200° C. or more was often necessary. As a result, oxidation occurred in this step, which adversely affected performance.

Also, even if an antiferromagnetic material is used of a type which does not need heat treatment, at the stage of actually manufacturing the read/write head, a step of curing the resist of the write head section is indispensable. In this step, heat treatment at a temperature of 200° C. or more was necessary, so oxidation of the magnetoresistance effect film occurred at the stage of processing to form a magnetic head. Also, when a metal was employed as the protective film, if the film thickness was large, due to the conductivity possessed by the metal, there was the problem that a large sensing current, which did not contribute to a change in magnetoresistance, flowed in the protective film and as a result the sensor output was lowered. Also, if the film thickness was small, the oxidation penetrated through the metallic layer into the magnetoresistance effect section, i.e. it could not serve its function as a protective layer.

SUMMARY OF THE INVENTION

An object of the present invention is to provide a magnetoresistance effect device and magnetoresistance effect sensor used by a magnetoresistance detection system and a magnetic storage system which are of excellent reliability by ensuring prevention of oxidation of the magnetoresistance effect device in the heating step of manufacture of the read/write head, a sufficient rate of change of resistance, a sufficiently large exchange coupling magnetic field applied to the fixed magnetic field layer from the antiferromagnetic layer and a sufficiently small coercive force of the free magnetic layer by providing a suitable protective film on the uppermost layer of the magnetoresistance effect device. In order to achieve this object, according to the present invention, in a magnetoresistance effect device having a basic construction wherein there is formed a unit consisting of multi-layer films: /magnetic layer/non-magnetic layer/ magnetic layer/antiferromagnetic layer/ or /antiferromagnetic layer/magnetic layer/non-magnetic layer/ magnetic layer, in a protective film formed on the magnetoresistance effect device there is employed a film of film thickness at least 2 [nm] and less than 7 [nm] consisting of a metal, oxide material, nitride material, mixture of oxide material and nitride material, metal/oxide double layer film, metal/nitride double layer film, or metal/(mixture of oxide and nitride material) double layer film.

If metal is employed as the protective film, the protective film is electrically conductive, so if the protective film thickness is large, the proportion of sensing current that is branched into the protective film is increased. Since the current flowing through the protective film does not contribute to a change of the magnetoresistance, the rate of change of magnetoresistance of the device is decreased, diminishing the output of the head. If the thickness of the protective film is small, the current flowing through the protective film is not particularly great, so the decrease in output due to branching to the protective film is small. On the other hand, if the film thickness is small, the effectiveness of the protective film in protecting the magnetoresistance device from oxidation is decreased. Consequently, there is an optimum region in the film thickness of the metal protective film.

Oxide or nitride are generally essentially non-conductive, so, even if their film thickness is large, the diminution in the rate of change of magnetoresistance due to branching of the sensing current into the protective film not contributing to change of magnetoresistance, such as happens with a metallic protective film, cannot occur. The film thickness can therefore be set to a large value, so in the high-temperature step in the manufacture of a read/write head, entry of oxygen into the magnetoresistance effect device can be effectively prevented so that finally a large Hex, large MR ratio and small Hc of the free magnetic layer can be obtained.

However, oxide or nitride have poor compatibility at the atomic level at the interface with the element constituted by a /magnetic layer/non-magnetic layer/magnetic layer/ antiferromagnetic layer/ or /antiferromagnetic layer/ magnetic layer/non-magnetic layer/magnetic layer unit which may result in slight deterioration of performance after the high-temperature process. In this case, better performance can be obtained after the high-temperature process by inserting a metal of good compatibility at the atomic level with both the unit and oxide or nitride between the unit and the oxide or nitride.

By means of the above, a magnetoresistance effect device and a magnetoresistance effect sensor used in a magnetoresistance detection system and magnetic storage system can be obtained whereby excellent characteristics are obtained in regard to output value, output waveform, and bit error rate and which can provide good characteristics also in regard to thermal reliability.

BRIEF DESCRIPTION OF THE DRAWINGS

Table 1 is a table showing the characteristics of a prior art magnetoresistance effect device in relation to the type of the antiferromagnetic layer.

Table 2 is a table showing the characteristics of a magnetoresistance effect device according to the present invention in relation to the type of the protective layer.

Table 3 is a table showing the characteristics of a magnetoresistance effect device according to the present invention in relation to the type of the protective layer.

Table 4 is a table showing the characteristics of a magnetoresistance effect device according to the present invention in relation to the type of the protective layer.

Table 5 is a table showing the characteristics of a magnetoresistance effect device according to the present invention in relation to the type of the protective layer.

Table 6 is a table showing the characteristics of a magnetoresistance effect device according to the present invention in relation to the type of the protective layer.

Table 7 is a table showing the characteristics of a magnetoresistance effect device according to the present invention in relation to the type of the protective layer.

Table 8 is a table showing the characteristics of a magnetoresistance effect device according to the present invention in relation to the type of the protective layer.

Table 9 is a table showing the characteristics of a magnetoresistance effect device according to the present invention in relation to the type of the protective layer.

Table 10 is a table showing the characteristics of a magnetoresistance effect device according to the present invention in relation to the type of the antiferromagnetic layer.

Table 11 is a table showing the characteristics of a magnetoresistance effect device according to the present invention in relation to the structures of FIG. 5 to FIG. 12.

Table 12 is a table showing the characteristics of the magnetoresistance effect sensor of FIG. 1 in relation to the type of the magnetoresistance effect device.

Table 13 is a table showing the characteristics of the magnetoresistance effect sensor of FIG. 1 in relation to the type of the magnetoresistance effect device.

Table 14 is a table showing the characteristics of the magnetoresistance effect sensor of FIG. 1 in relation to the type of the magnetoresistance effect device.

Table 15 is a table showing the correspondence of test manufacture number and protective film in Table 12 to Table 14 and Table 16 to Table 18.

Table 16 is a table showing the characteristics of the magnetoresistance effect sensor of FIG. 2 in relation to the type of the magnetoresistance effect device.

Table 17 is a table showing the characteristics of the magnetoresistance effect sensor of FIG. 2 in relation to the type of the magnetoresistance effect device; and Table 18 is a table showing the characteristics of the magnetoresistance effect sensor of FIG. 2 in relation to the type of the magnetoresistance effect device.

DESCRIPTION OF THE PREFERRED EMBODIMENTS

Figure 1:
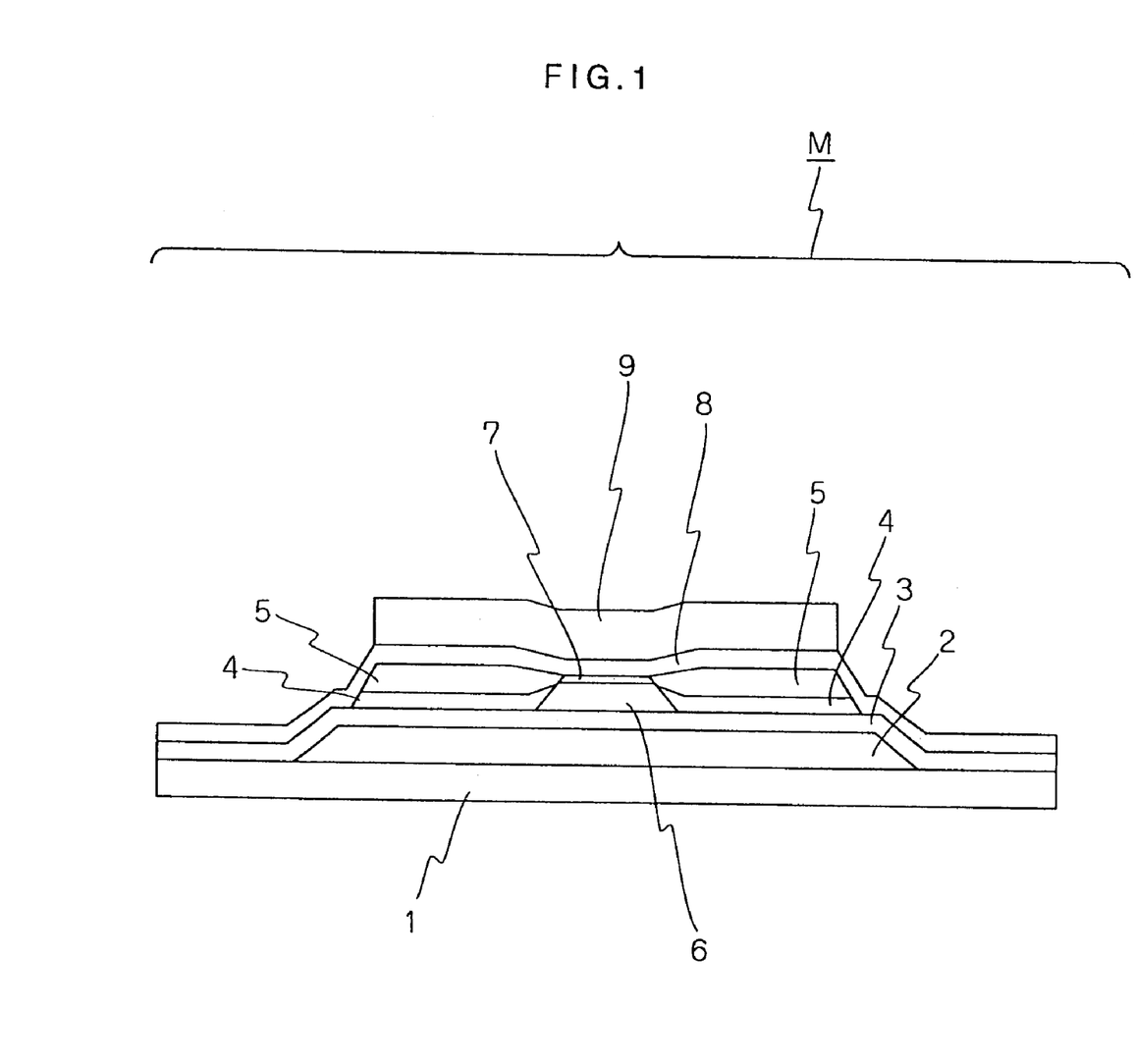
FIG. 1 is a diagrammatic view showing the construction of a magnetoresistance effect sensor using a magnetoresistance effect device according to the present invention.
Figure 2:
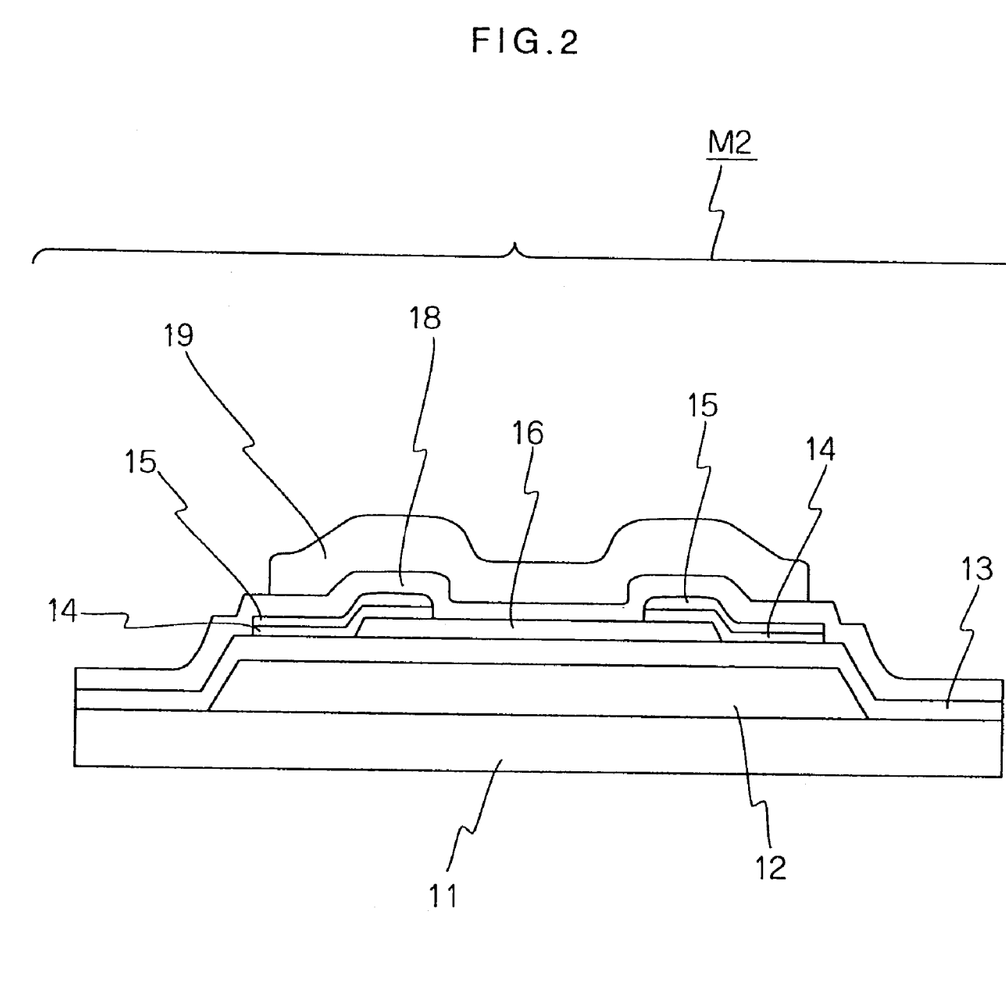
FIG. 2 is a diagrammatic view showing the construction of a magnetoresistance effect sensor using a magnetoresistance effect device according to the present invention.

For a shielded type magnetoresistance effect sensor according to the present invention, the construction shown in FIG. 1 and FIG. 2 may be employed.

In the magnetoresistance effect sensor M1 of FIG. 1, a lower shielding layer 2, a lower gap layer 3 and a magnetoresistance effect device 6 are laminated onto a substrate 1. A gap-defining insulating layer 7 may be laminated on top of these. Lower shielding layer 2 is usually patterned to the appropriate size by a photoresist (PR) step. Magnetoresistance effect device 6 is patterned to the appropriate size and shape by a photoresist (PR) step and a vertical bias layer 4 and lower electrode layer 5 are laminated in sequence so as to join at their edges. Upper gap layer 8 and upper shielding layer 9 are laminated in sequence on top of these.

In the magnetoresistance effect sensor M2 of FIG. 2, a lower shielding layer 12, a lower gap layer 13 and a magnetoresistance effect device 16 are laminated onto a substrate 11. Lower shielding layer 12 is usually patterned to the appropriate size by a photoresist (PR) step. Magnetoresistance effect device 16 is patterned to the appropriate size and shape by a photoresist (PR) step and a vertical bias layer 14 and lower electrode layer 15 are laminated in sequence thereon so as to partially overlap this. Upper gap layer 18 and upper shielding layer 19 are laminated in sequence on top of these.

As the lower shielding layer of the type of FIG. 1 and FIG. 2, NiFe, CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi alloys, FeAlSi or iron nitride type materials may be employed, their film thickness being suitably in the range 0.3~10 [$\mu$m]. Further, as the lower gap layer, alumina, SiO2, aluminium nitride, silicon nitride, or diamond-like carbon etc. may be employed, a range of use of 0.01~0.20 [$\mu$m] being preferred.

Figure 3:
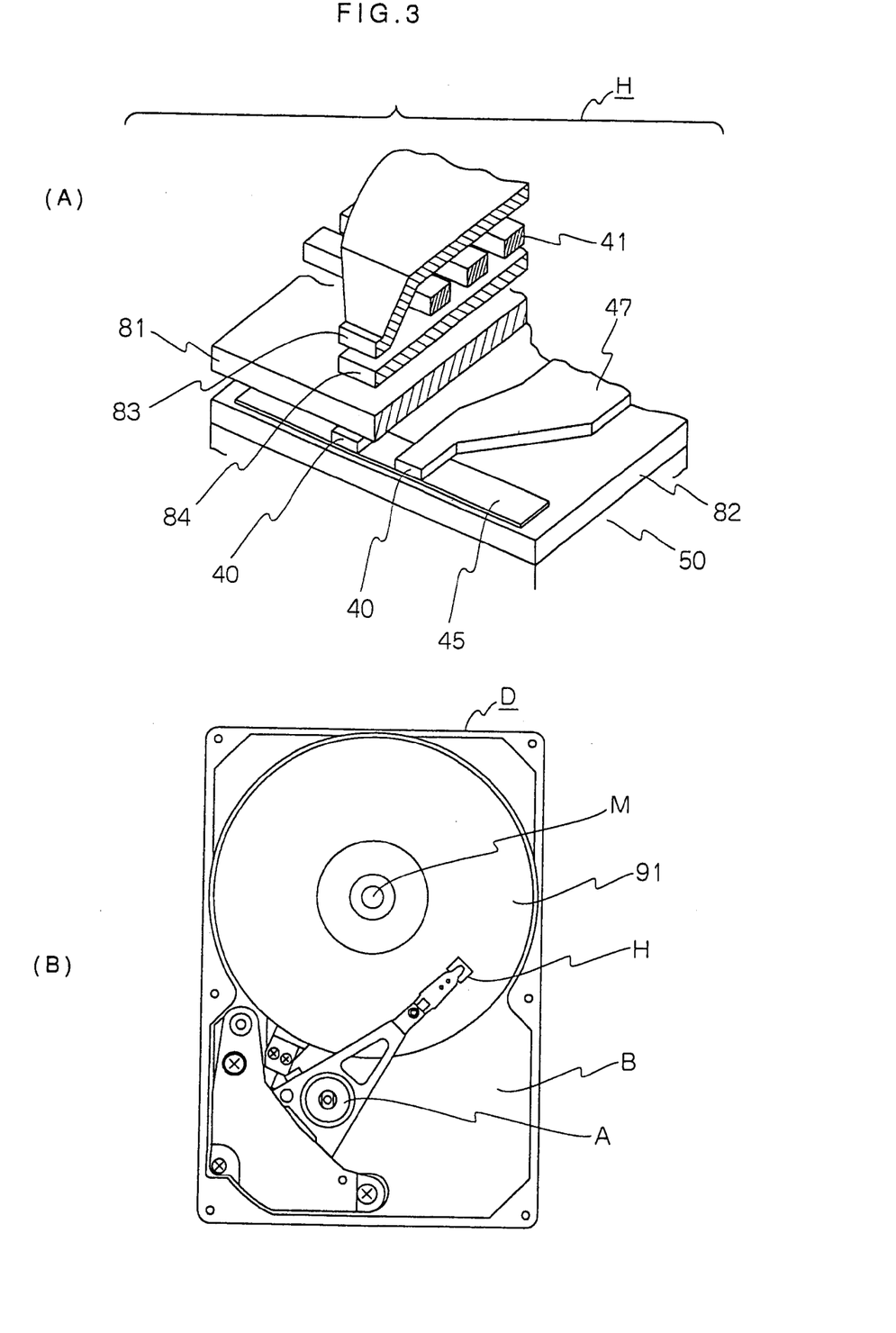
FIG. 3 is a diagrammatic view showing a read/write head using a magnetoresistance effect device according to the present invention and a magnetic disk device using this.

As the lower electrode layer, Zr, Ta, or Mo are desirable either alone or as alloys or mixtures thereof. A range of film thickness of 0.01~0.10 [$\mu$m] may be employed. As the vertical bias layer, CoCrPt, CoCr, CoPt, CoCrTa, FeMn, NiMn, IrMn, PtPdMn, ReMn, PtMn, CrMn, Ni oxide, iron oxide, a mixture of Ni oxide and Co oxide, a mixture of Ni oxide and Fe oxide, a Ni oxide/Co oxide double layer film, or a Ni oxide/Fe oxide double layer film can be employed. As the gap-defining insulating layer, alumina, SiO2, aluminium nitride, silicon nitride, or diamond-like carbon etc. may be suitably employed, preferably being used in a range of 0.005~0.05 [$\mu$m]. As the upper gap layer, alumina, SiO2, aluminium nitride, silicon nitride, or diamond-like carbon etc. may be suitably employed, preferably being used in a range of 0.01~0.20 [$\mu$m]. As the upper shielding layer, NiFe, CoZr, or CoFeB, CoZrMo, CoZrNb, CoZr, CoZrTa, CoHf, CoTa, CoTaHf, CoNbHf, CoZrNb, CoHfPd, CoTaZrNb, CoZrMoNi alloys, FeAlSi or iron nitride type materials may be employed, their film thickness being suitably in the range 0.3~10 [$\mu$m]. Such shielded type magnetoresistance effect sensors can form a write head section with the aid of an inductive coil and can thus be used as a read/write unitary head. FIG. 3 is a diagram of a read/write head. The read/write head comprises a read head that uses a magnetoresistance effect sensor according to the present invention and a write head of the inductive type. An example is shown in which this is mounted with a write head for longitudinal magnetic writing, but by combining it with a head for vertical magnetic writing, magnetoresistance effect device 45 according to the present invention could be used in vertical writing.

Figure 4:
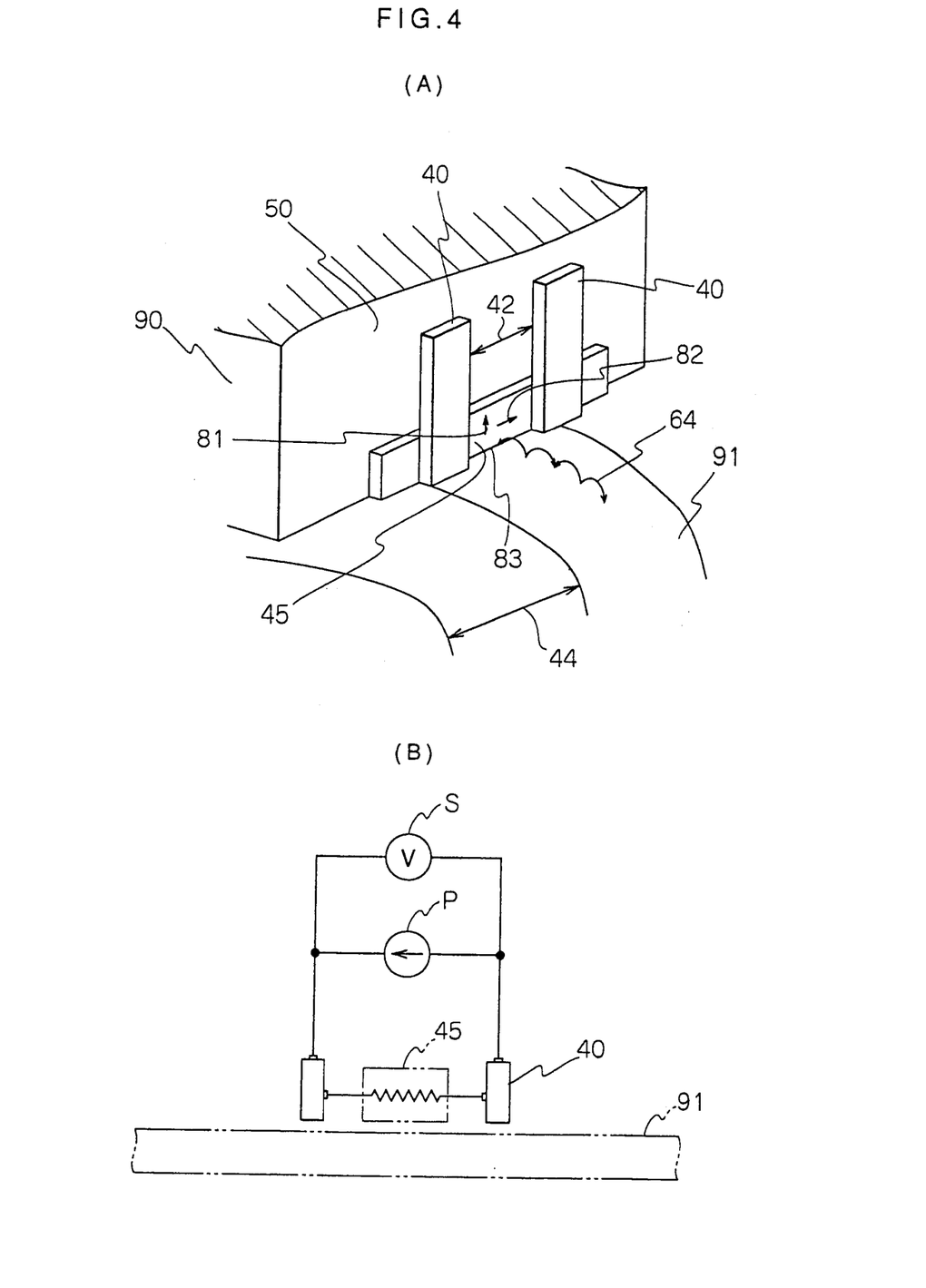
FIG. 4 is a diagram of a magnetic read/write device using a magnetoresistance effect device according to the present invention and a circuit diagram for detection of the magnetoresistance effect.

In a read/write head a read head comprising a lower shield film 82, magnetoresistance effect device 45 and electrode 40 and upper shield film 81 and a write head comprising a lower magnetic film 84, coil 41 and upper magnetic film 83 are formed on a substrate 50. Upper shield film 81 and lower magnetic film 84 may be common. By means of this read/write head, signals can be written onto the recording medium and signals can be read from the recording medium. By thus forming the sensing portion of the read head and the magnetic gap of the write head in overlapping positions on the same slider, positional location onto the same track can be performed simultaneously. This read/write head is processed into a slider and mounted on a magnetic read-write device. FIG. 4 is a diagram of a magnetic read/write device using a magnetoresistance effect device according to the present invention. A magnetoresistance effect device 45 and electrode film 40 are formed on a substrate 50 that also serves as a head slider 90 and reading is performed by positional location of this onto magnetic recording medium 91. Magnetic recording medium 91 is rotated and head slider 90 is moved relatively over magnetic recording medium 91 facing it with a height of 0.2 [μm] or less or in a contacting condition. By means of this mechanism, magnetoresistance effect device 45 is set in a position in which a magnetic signal that is written on magnetic recording medium 91 can be read from this leakage magnetic field. For example, a fixed current is supplied to magnetoresistance effect device 45 from a low-current power source P and a resistance detector S detects the change of voltage produced by change of resistance.

FIG. 5 to FIG. 12 are diagrams of the film structure of a magnetoresistance effect device according to the present invention.

Figure 5:
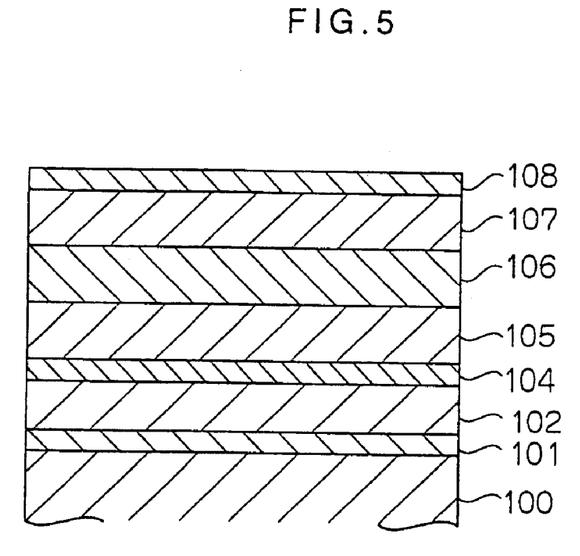
FIG. 5 is a cross-sectional view showing a magnetoresistance effect device according to the present invention.

First of all, the magnetoresistance effect device of FIG. 5 has a construction in which an underlayer 101, first free magnetic layer 102, non-magnetic layer 104, MR enhancement layer 105, fixed magnetic layer 106, antiferromagnetic layer 107 and protective film 108 are sequentially laminated onto a substrate 100.

Figure 6:
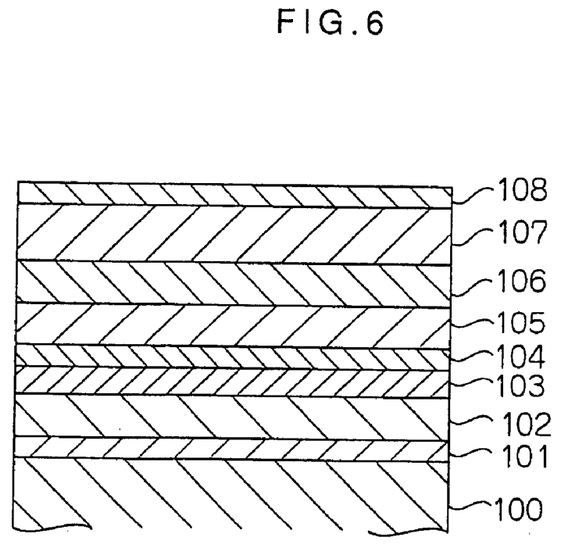
FIG. 6 is a cross-sectional view showing a magnetoresistance effect device according to the present invention.

The magnetoresistance effect device of FIG. 6 has a construction in which an underlayer 101, first free magnetic layer 102, second free magnetic layer 103, non-magnetic layer,, 104, MR enhancement layer 105, fixed magnetic layer 106, antiferromagnetic layer 107 and protective film 108 are sequentially laminated onto a substrate 100.

Figure 7:
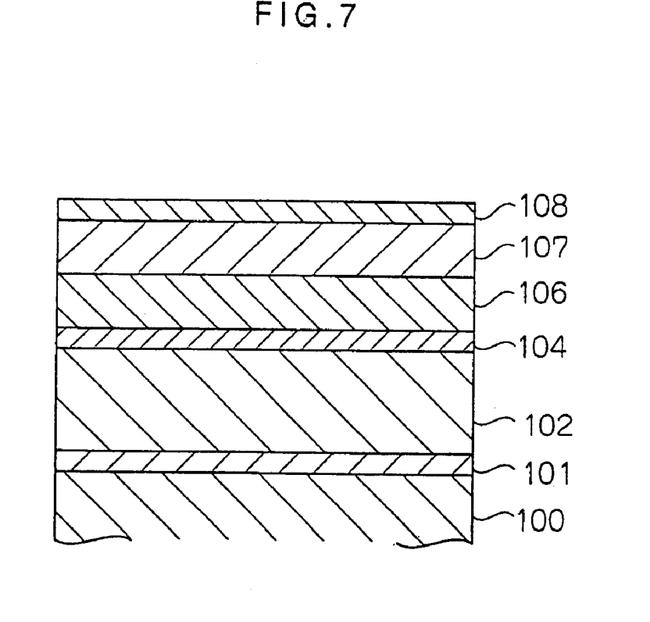
FIG. 7 is a cross-sectional view showing a magnetoresistance effect device according to the present invention.

The magnetoresistance effect device of FIG. 7 has a construction in which an underlayer 101, first free magnetic layer 102, non-magnetic layer 104, fixed magnetic layer 106, antiferromagnetic layer 107 and protective film 108 are sequentially laminated onto a substrate 100.

Figure 8:
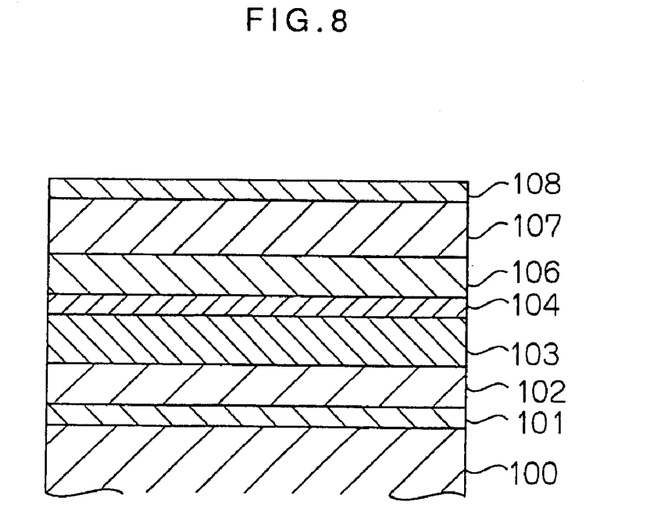
FIG. 8 is a cross-sectional view showing a magnetoresistance effect device according to the present invention.

The magnetoresistance effect device of FIG. 8 has a construction in which an underlayer 101, first free magnetic layer 102, second free magnetic layer 103, non-magnetic layer 104, fixed magnetic layer 106, antiferromagnetic layer 107 and protective film 108 are sequentially laminated onto a substrate 100.

Figure 9:
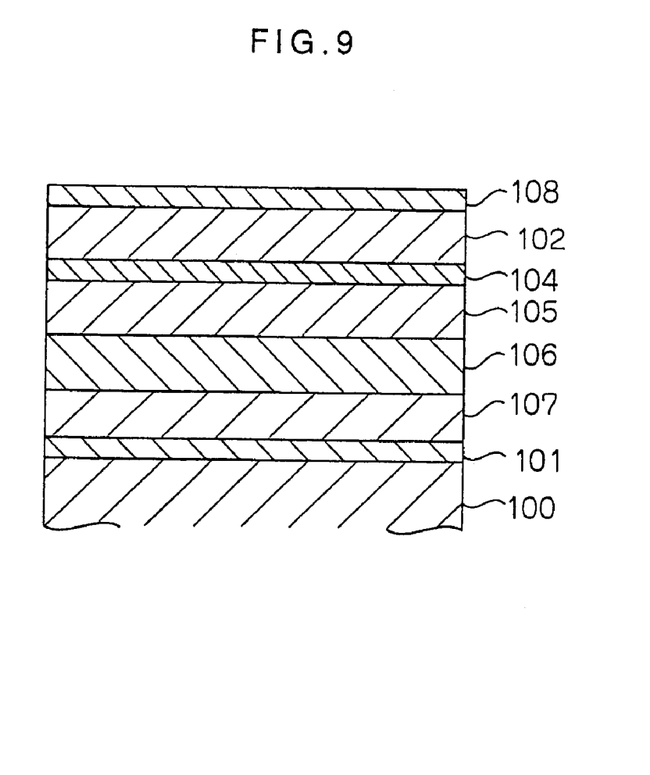
FIG. 9 is a cross-sectional view showing a magnetoresistance effect device according to the present invention.

The magnetoresistance effect device of FIG. 9 has a construction in which an underlayer 101, antiferromagnetic layer 107, fixed magnetic layer 106, MR enhancement layer 105, non-magnetic layer 104, first free magnetic layer 102 and protective film 108 are laminated in sequence on to a substrate 100.

Figure 10:
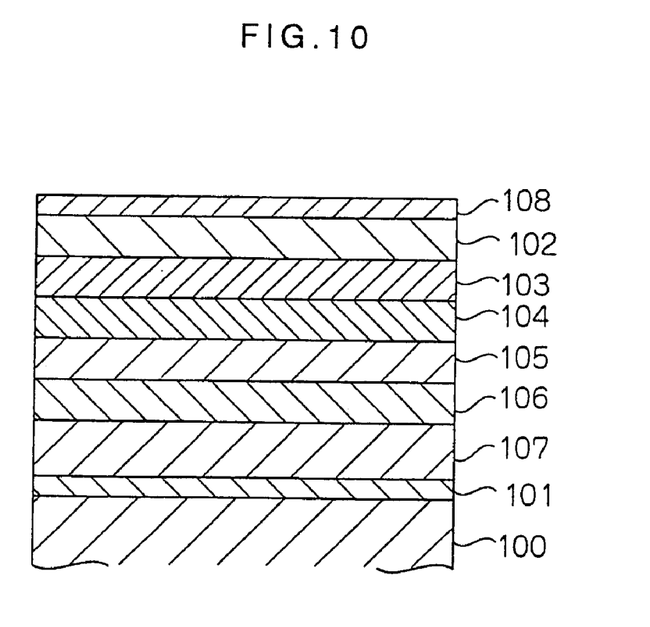
FIG. 10 is a cross-sectional view showing a magnetoresistance effect device according to the present invention.

The magnetoresistance effect device of FIG. 10 has a construction in which an underlayer 101, antiferromagnetic layer 107, fixed magnetic layer 106, MR enhancement layer 105, non-magnetic layer 104, second free magnetic layer 103, first free magnetic layer 102 and protective film 108 are laminated in sequence on to a substrate 100.

Figure 11:
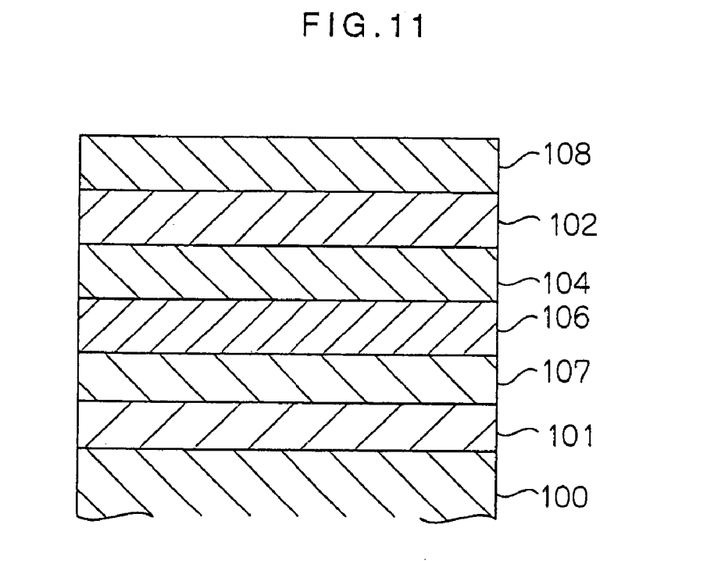
FIG. 11 is a cross-sectional view showing a magnetoresistance effect device according to the present invention.

The magnetoresistance effect device of FIG. 11 has a construction in which an underlayer 101, antiferromagnetic layer 107, fixed magnetic layer 106, non-magnetic layer 104, first free magnetic layer 102 and protective film 108 are laminated in sequence on to a substrate 100.

Figure 12:
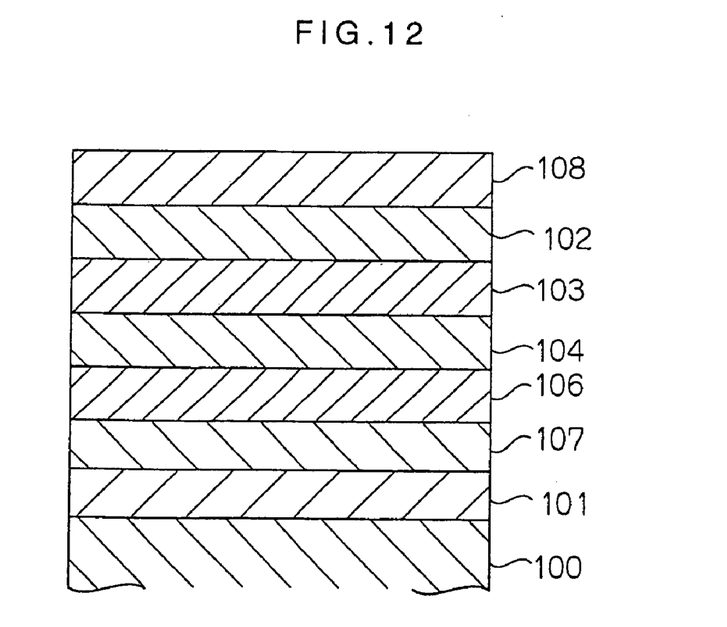
FIG. 12 is a cross-sectional view showing a magnetoresistance effect device according to the present invention.

The magnetoresistance effect device of FIG. 12 has a construction in which an underlayer 101, antiferromagnetic layer 107, fixed magnetic layer 106, non-magnetic layer 104, second free magnetic layer 103, first free magnetic layer 102 and protective film 108 are laminated in sequence on to a substrate 100.

Two or more metals may be employed as underlayer 101. Specifically, a multi-layer film consisting of Ta, Hf, Zr, W, Cr, Ti, Mo, Pt, Ni, Ir, Cu, Ag, Co, Zn, Ru, Rh, Re, Au, Os, Pd, Nb, or V etc. may be employed. For example, a thickness of 0.2~6.0 [nm] of Ta, 0.2~1.5 [nm] of Hf, or 0.2~2.5 [nm] of Zr may be employed.

As the first free magnetic layer 102 and second free magnetic layer 103, NiFe, CoFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, CoZrMoNi alloy or amorphous magnetic material may be employed. As the thickness of these, 1~10 [nm] is suitable, and preferably 0.1~5 [nm]. As non-magnetic layer 104, Cu, a material obtained by adding about 1~20 [at %] of Ag to Cu, a material obtained by adding about 1~2 [at %] of Re to Cu, or a Cu-Au alloy may be employed. A film thickness of 2~4 [nm] is preferred. As MR enhancement layer 105, Co, NiFeCo, FeCo etc. or CoFeB, CoZrMo, CoZrNb, CoZr,.CoZrTa, CoHf, CoTa, CoTaHf, CoNbHf, CoZrNb, CoHfPd, CoTaZrNb, CoZrMoNi alloy or amorphous magnetic material may be employed. A film thickness of about 0.5~5 [nm] is desirable. Although if an MR enhancement layer 105 is not employed, the MR ratio is lowered compared with the case where it is employed, the number of manufacturing steps can be reduced by not employing it. As fixed magnetic layer 106, of the group based on Co, Ni, and Fe, these may be employed alone, in the form of alloys, or as a laminated film. A film thickness of about 1~50 [nm] is desirable. As antiferromagnetic layer 107, FeMn, NiMn, IrMn, PtPdMn, ReMn, PtMn, CrMn, Ni oxide, Fe oxide, a mixture of Ni oxide and Co oxide, a mixture of Ni oxide and Fe oxide, a double layer film of Ni oxide/Co oxide, or a double layer film of Ni oxide/Fe oxide etc. may be employed.

As protective film 108, metal, oxide, nitride, a mixture of oxide and nitride, a double layer film of metal/oxide, a double layer film of metal/nitride, or a double layer film of metal/(mixture of oxide and nitride) may be employed. In the case where a single metallic layer is employed, this may desirably be one selected from the group of Ti, V, Cr, Co, Cu, Zn, Y, Zr, Nb, Mo, Tc, Ru, Rh, Pd, Ag, Hf, Ta, W, Re, Os, Ir, Pt and Au, or an alloy of two or more of these. As the oxide or nitride, oxides and nitrides of Si, Al, Ti or Ta are preferred. As the metal in a double-layer film, one or an alloy of two or more selected from the group consisting of Ta, Hf, Zr, W, Cr, Ti, Mo, Pt, Ni, Ir, Cu, Ag, Co, Zn, Ru, Re, Au, Os, Pd, Nb, V or Y may be employed.

In order to make a comparison with a magnetoresistance effect device according to the present invention, using a magnetoresistance effect device of the construction of FIG. 5, the characteristics when a protective film was not employed were examined.

A Corning 7059 glass substrate of thickness 1.1 [nm] was employed as substrate 100, and Ta of thickness 3.0 [nm] was employed as underlayer 101. Also, as first free magnetic layer 102, $Ni_{81}Fe_{19}$ (at %, based on the target composition during deposition by sputtering; which is not the same as the actual film composition. The same applies to the elements below) of 8.0 [nm] was employed. For the non-magnetic layer 104, 2.8 [nm] of Cu were employed. For the MR enhancement layer 105, 4 [nm] of $Co_{90}Fe_{10}$ [at %] were employed. For the fixed magnetic layer 106, 2.6 [nm] of $Ni_{81}Fe_{19}$ [at %] were employed. Also, for the first free magnetic layer 102, use is made of 8.0 [nm] of $Ni_{81}Fe_{19}$ (at %, being the target composition during film deposition by sputtering; which is different from the film composition. The same applies to the elements listed below.) For the non-magnetic layer 104, 2.8 [nm] of Cu, for the MR enhancement layer 105, 4 [nm] of $Co_{90}Fe_{10}$ [at %], for the fixed magnetic layer 106, 2.6 [nm] of $Ni_{81}Fe_{19}$ [at %], and for the antiferromagnetic layer 107, 20 [nm] of $Fe_{50}Mn_{50}$ [at %] were employed.

When FeMn is employed as antiferromagnetic layer 107, an exchange coupling magnetic field is applied from antiferromagnetic layer 107 to fixed magnetic layer 106 even without heat treatment, so heat treatment does not need to be performed after film deposition. As a result, a free magnetic layer coercive force of 1.0 [Oe], an exchange coupling magnetic field Hex of 520 [Oe] applied from the antiferromagnetic layer 107 to the fixed magnetic layer 106, and an MR ratio of 5.2 [%] were obtained. Heat treatment was performed on this magnetoresistance effect device at 270° C. for 5 hours. As a result, Hex dropped from 520 [Oe] to 220 [Oe] and the MR ratio dropped from 5.2 [%] to 2.8 [%]. The drop in the MR ratio appears to be associated with changes produced by the annealing processing in the condition of the interface between the Cu layer and the magnetic layer, but the drop in Hex is due to oxidation of the FeMn layer.

For substrate 100, a Corning 7059 glass substrate of thickness 1.1 [nm] was employed, while for underlayer 101 Ta of 3.0 [nm] and for first free magnetic layer 102 $Ni_{81}Fe_{19}$ [at %] of thickness 8.0 [nm] were employed. For non-magnetic layer 104, Cu of thickness 2.8 [nm] was employed, for MR enhancement layer 109, $Co_{90}Fe_{10}$ [at %] of thickness 0.4 [nm] were employed, for fixed magnetic layer 106, $Ni_{81}Fe_{19}$ [at %] of thickness 2.6 [nm], and for antiferromagnetic layer 107, various materials were employed. In order that an exchange coupling force should be applied from antiferromagnetic layer 107 to fixed magnetic layer 106, after film deposition heat treatment was performed under vacuum of $3\times10^{-6}$ [torr] for 5 hours at the respective temperatures shown in Table 1.

The characteristics obtained as a result are shown in Table 1. Comparing the characteristics with the characteristics prior to the treatment in the case where the FeMn described above was employed as the antiferromagnetic layer 107, it can be seen that although the Hc of the free magnetic layer does not change very much, the MR ratio and the Hex become lower. The reason for the low MR ratio is believed to be related to the change in the condition of the interface of the Cu layer and the magnetic layer brought about by heat treatment, but the drop in Hex is believed to be due to oxidation of antiferromagnetic layer 107.

Next, the characteristics of a magnetoresistance effect device according to the present invention will be described. In the magnetic resonance effect device of FIG. 5, for substrate 100, Corning 7059 glass substrate of thickness 1.1 [nm] was employed; for underlayer 101, Ta of 3.0 [nm] was employed, for first free magnetic layer 102, $Ni_{81}Fe_{19}$ [at %] of thickness 8.0 [nm] was employed, while for non-magnetic layer 104, Cu of 2.8 [nm], for MR enhancement layer 105, $Co_{90}Fe_{10}$ [at %] of 0.4 [nm], for fixed magnetic layer 106, Ni81Fe19 [at %] of thickness 2.6 [nm] and for antiferromagnetic layer 107, Ni46Mn54 of thickness 20 [nm] were employed, while for protective film 108, various metallic materials of various film thicknesses shown in Table 2 to Table 4 were employed. In order for an exchange coupling magnetic field to be applied from antiferromagnetic layer 107 to fixed magnetic layer 106, heat treatment for 5 hours at 270° C. was performed after film deposition, under vacuum of $2\times10^{-6}$ [torr]. The characteristics obtained as a result are shown in Table 2 to Table 4. For each item, the first column indicates the Hc [Oe] of the free magnetic layer 102, the second column indicates the MR ratio [%], and the third column indicates the Hex [Oe], respectively. The Hc of the free magnetic layer 102 is practically fixed for all materials and all film thicknesses of protective film 108. The MR ratio decreased with rise in the film thickness of the protective film 108 for all materials. If the film thickness exceeds 7 [nm] the MR ratio in general shows a steep decline. From this, it can be seen that, from the point of view of the MR ratio, the film thickness of protective film 108 should suitably be less than 7 [nm]. Hex increased monotonically with increase of film thickness of protective film 108. Comparatively high values are obtained for film thicknesses of the protecting film 108 of more than 2 [nm]. From this, it can be seen that, from the point of view of Hex, the film thickness should be at least 2 [nm]. It has been found that the range of film thickness of protective film 108 for which good values are obtained for all of the Hc of the free magnetic layer 102, the MR ratio and Hex is between 2 [nm] and 7 [nm].

In the magnetoresistance effect device of the structure of FIG. 5, for substrate 100, Corning 7095 glass substrate of thickness 1.1 [nm] was employed; for underlayer 101, Ta of thickness 1.0 [nm] was employed; for first free magnetic layer 102, $Ni_{81}Fe_{19}$ [at %] of thickness 8.0 [nm] was employed; for non-magnetic layer 104, Cu of thickness 2.8 [nm] was employed; for MR enhancement layer 105, Co90Fe10 [at %] of thickness 4.0 [nm] was employed; for fixed magnetic layer 106, $Ni_{81}Fe_{19}$ [at %] of thickness 2.6 [nm] was employed; for antiferromagnetic layer 107, $Ni_{46}Mn_{54}$ of thickness 20 [nm] was employed; and for protective film 108, the various materials shown in Table 5 were employed (film thickness 50 nm).

In order to enable an exchange coupling between magnetic field to be applied from antiferromagnetic film 107 to fixed magnetic layer 16, after film deposition, heat treatment was performed for 5 hours at 270° C. under vacuum of 2×10–6 [torr]. The characteristics obtained are shown in Table 5. In the magnetoresistance effect element of the structure of FIG. 5, Corning 7059 glass substrate of thickness 1.1 [nm] was employed for substrate 100; Ta of thickness 3.0 [nm] was employed for underlayer 101; $Ni_{81}Fe_{19}$ [at %] of thickness 8.0 [nm] was employed for first free magnetic layer 102; Cu of thickness 2.0 [nm] was employed for non-magnetic layer 104; $Co_{90}Fe_{10}$ [at %] of thickness 0.4 [nm] was employed for MR enhancement layer 105; Ni81Fe19 [at %] of thickness 2.6 [nm] was employed for fixed magnetic layer 106; and Ni46Mn54 of thickness 20 [nm] was employed for antiferromagnetic layer 107; while a laminated layer of the metallic protective films (3 [nm]) shown in Table 6 and an Al oxide protective film (50 [nm]) was employed for protective film 108.

The metallic protective film was employed in contact with the NiMn layer. In order for an exchange coupling magnetic field to be applied from antiferromagnetic layer 107 to fixed magnetic layer 106, heat treatment was performed for 5 hours at 270° C. in a vacuum of 2×10–6 [torr] after film deposition. The characteristics obtained are shown in Table 6. In comparison with the case where an Al oxide layer was employed on its own, with this protective film, while the free magnetic layer Hc and MR ratio were practically unchanged, the Hex was larger for practically all materials. In the magnetoresistance effect elements of FIG. 5, for substrate 100, there was employed Corning 7059 glass substrate of thickness 1.1 [nm]; for underlayer 101 there was employed Ta of thickness 3.0 [nm]; for first free magnetic layer 102, there was employed $Ni_{81}Fe_{19}$ [at %] of thickness 8.0 [nm]; for non-magnetic layer 104, there was employed Cu of thickness 3.8 [nm]; for MR enhancement layer 105, there was employed $Co_{90}Fe_{10}$ [at %] of thickness 0.4 [nm]; for fixed magnetic layer 106, there was employed $Ni_{81}Fe_{19}$ [at %] of thickness 2.6 [nm]; and for antiferromagnetic layer 107, there was employed $Ni_{46}Mn_{54}$ of thickness 20 [nm]. For protective film 108, a laminated double-layer film consisting of a protective film of Ta (3 [nm]) and the non-metallic protective films shown in Table 7 (50 [nm]) was employed.

The Ta protective film was employed in contact with the NiMn layer. Heat treatment was performed for 5 hours at 270° C. in a vacuum of 2×10–6 [torr] after film deposition in order to arrange for an exchange coupling magnetic field to be applied from antiferromagnetic layer 107 to fixed magnetic layer 106. The characteristics obtained are shown in Table 7.

For substrate 100, there was employed Corning 7059 glass substrate of thickness 1.1 [nm]; for underlayer 101, there was employed Ta of thickness 3.0 [nm]; for first free magnetic layer 102, there was employed $Ni_{81}Fe_{19}$ [at %] of thickness 8.0 [nm]; for non-magnetic layer 104, there was employed Cu of thickness 3.8 [nm]; for MR enhancement layer 105, there was employed $Co_{90}Fe_{10}$ [at %] of thickness of 0.4 [nm]; for fixed magnetic layer 106 there was employed $Ni_{81}Fe_{19}$ [at %] of thickness 2.6 [nm]; and for antiferromagnetic layer 107, there was employed $Ni_{46}Mn_{54}$ of thickness 20 [nm]. A laminated double-layer film consisting of a Ta protective film (3 [nm]) and an Al oxide protective film [X nm] was employed for protective film 108.

The Ta protective film was employed in contact with the NiMn layer. In order for an exchange coupling magnetic field to be applied from antiferromagnetic layer 107 to fixed magnetic layer 106, heat treatment was performed for 5 hours at 270° C. in a vacuum of 2×10$^{-6}$ [torr] after film deposition. The characteristics when the thickness of the Al oxide layer was varied are shown in FIG. 20. Hc of the free magnetic layer 102 was practically fixed independent of the film thickness of the Al oxide layer, but the MR ratio and Hex increased with increase in film thickness, becoming practically fixed at a film thickness of above 30 [nm].

In the magnetoresistance effect sensor of FIG. 5, for substrate 100, there was used Corning 7059 glass substrate of thickness 1.1 [nm]; for underlayer 101 there was used Ta of thickness 3.0 [nm]; for first free magnetic layer 102 there was used $Ni_{81}Fe_{19}$ [at %] of thickness 8.0 [nm]; for non-magnetic layer 104, there was used Cu of thickness 2.8 [nm]; for MR enhancement layer 105 there was used $Co_{90}Fe_{10}$ [at %] of thickness 0.4 [nm]; for fixed magnetic layer 106, there was used $Ni_{81}Fe_{19}$ [at %] of 2.6 [nm]; for antiferromagnetic layer 107 there was used $Ni_{46}Mn_{54}$ of thickness 20 [nm]; and for protective film 108 there was employed a laminated double-layer film consisting of a Ta protective film [X nm] and Al oxide protective film (50 [nm]).

The Ta protective film was employed in contact with the NiMn layer. In order for an exchange coupling magnetic field to be applied from antiferromagnetic layer 107 to fixed magnetic layer 106, heat treatment was performed for 5 hours at 270° C. in a vacuum of 2×10–6 [torr] after film deposition. The characteristics when the Ta layer film thickness was varied are shown in Table 9. Regarding the MR ratio, this was practically fixed up to a Ta film thickness of 5.0 [nm], but, above 7.0 [nm], tended to decrease. It is believed that this is due to current branching into the Ta layer. Hex increased with increase in the Ta layer film thickness, reaching a practically constant value at 2.0 [nm] or above. In the magnetoresistance effect elements of FIG. 5, for substrate 100 there was employed a Corning 7059 glass substrate of thickness 1.1 [nm]; for the underlayer, there was employed Ta of thickness 3.0 [nm]; for first free magnetic layer 102 there was employed $Ni_{81}Fe_{19}$ [at %] of thickness 8.0 [nm]; for non-magnetic layer 104 Cu of thickness 2.8 [nm] was employed; for MR enhancement layer 105, $Co_{90}Fe_{10}$ [at %] of 0.4 [nm] thickness was employed; for fixed magnetic layer 106, $Ni_{81}Fe_{19}$ [at %] of 2.6 [nm] was employed; and for antiferromagnetic layer 107, various materials were employed. For protective film 108, there was employed a laminated double-layer film consisting of Ta protective film (3 [nm]) and a non-metallic protecting film (50 [nm]). The Ta protective film was employed in contact with the NiMn layer etc. (antiferromagnetic layer).

In order to apply an exchange coupling force from the antiferromagnetic layer to the fixed magnetic layer, heat treatment was performed for 5 hours at the temperatures respectively shown in Table 10 in a vacuum of 3×10–6 [torr] after film deposition. The characteristics obtained as a result are shown in Table 10. In the case of all the antiferromagnetic layers 107, the Hex was found to be improved compared with the case where no protective film was employed. Regarding the Hc of the free magnetic layer 102 and the MR ratio, in the magnetoresistance effect device of the construction of FIG. 5 to FIG. 12, the substrate 100, a Corning 7059 glass substrate of thickness of 1.1 [nm] was employed; for the underlayer, Ta of thickness 3.0 [nm] was employed; for first free magnetic layer 102, $Ni_{81}Fe_{19}$ [at %] of thickness 8.0 [nm] was employed; for second free magnetic layer 103, $Co_{90}Fe_{10}$ of thickness 1.0 [nm] was employed; for non-magnetic layer 103, Cu of thickness 2.8 [nm] was employed; for MR enhancement layer 105, $Co_{90}Fe_{10}$ [at %] of thickness 0.4 [nm] was employed; for fixed magnetic layer 106, $Ni_{81}Fe_{19}$ [at %] of 2.6 [nm] thickness was employed; and for antiferromagnetic layer 107, $Ni_{46}Mn_{54}$ [at %] of thickness 20 [nm] was employed. For protective film 108, a laminated double-layer film consisting of a Ta protective film (3 [nm]) and a non-metallic protective film (50 [nm]) was employed.

The Ta protective film is employed in contact with what is, apart from the protective film, the uppermost layer of the magnetoresistance effect film (in the construction of FIG. 5~FIG. 8, this is the NiMn layer, and, in the construction of FIG. 9~FIG. 12, this is the NiFe layer) . In order for an exchange coupling force to be applied from the antiferromagnetic layer to the fixed magnetic layer, heat treatment was performed for 5 hours at 270° C. under vacuum of 3×10$^{-6}$ [torr] after film formation. The characteristics obtained as a result are shown in Table 11. In the case of all the structures, a satisfactory large Hex is ensured. Next, examples in which these magnetoresistance effect devices were applied to magnetoresistance effect sensors of the shielded type are illustrated.

Magnetoresistance effect sensors M of FIG. 1 were manufactured using magnetoresistance effect devices according to the present invention. NiFe was employed as the lower shielding layer 21, while alumina was employed as the lower gap layer 3. Magnetoresistance effect device 6 consists of: Ta (3 [nm])$Ni_{82}Fe_{18}$ (7 [nm])/$Co_{90}Fe_{10}$ [1.0 nm]/Cu [2.5 nm]/$Co_{90}Fe_{10}$ (1 [nm]) $Ni_{81}Fe_{19}$ (2.6 [nm])/$Ni_{46}Mn_{54}$ [20 nm]/protective film. These elements were processed to a size of 1×1 [μm] by a PR step. A lower electrode layer 5 of CoCrPt and Mo was laminated so as to contact the end of this magnetoresistance effect device 6. Alumina was employed as upper gap layer 8, while NiFe was employed as upper shielding layer 9. This magnetoresistance effect sensor N was processed to the form of a read/write unitary head as shown in FIG. 3 and also processed to the form of a slider. It was then used to record and reproduce data on a CoCrTa-type magnetic recording medium. The write track width was 1.5 [μm], the write gap was 0.2 [μm], the read track width was 1.0 [μm] and the read gap was 0.21 [μm]. The coercive force of the magnetic recording medium was 2.5 [kOe]. The reproduction output was measured for different recording mark lengths. The results of the measurement are shown in Table 12 to Table 14. The correspondence of sample numbers and protective films in Table 12 to Table 14 is as shown in Table 15.

Next, the magnetoresistance effect sensor M2 of FIG. 2 was manufactured using a magnetoresistance effect device according to the present invention. For the magnetoresistance effect device 16, the structure of FIG. 6 was employed, the lower shielding layer 12 being FeTaN, and the lower gap layer 13 being amorphous carbon. As the magnetoresistance effect device 16, Ta (3 [nm])/$Ni_{82}Fe_{18}$ (7 [nm])/$Co_{90}Fe_{10}$ [1.0 nm]/Cu [2.5 nm]/$Co_{90}Fe_{10}$ (1 [nm])/$Ni_{82}Fe_{18}$ (1 [nm])/$Ni_{46}Mn_{54}$ [20 nm]/protective film was employed, being processed to the size of 1×1 [μm] by a PR process. A lower electrode layer 15 of CoCrPt and Mo was deposited so as to partially overlap this magnetic effect resistance device 16. Alumina was employed as upper gap layer 18 and NiFe was employed as upper shielding layer 19.

This magnetoresistance effect sensor N2 was processed to the form of a read/write integral read/write head H and processed to the form of a slider and used to record and reproduce data on to a magnetic recording medium of the CoCrTa type. The write track width was 1.5 [μm], the write gap was 0.2 [μm], the read track width was 1.0 [μm] and the read gap was 0.21 [μm]. The coercive force of the magnetic recording medium was 2.5 [kOe]. The reproduction output was measured for different recording mark lengths. The results of the measurement are shown in Table 16 to Table 18. The relationship between sample numbers and protective films in Table 16 to Table 18 are the same as in Table 15.

Next, a magnetic disk apparatus D manufactured by applying the present invention will be described with reference to FIG. 3(B). In magnetic disk apparatus D, three magnetic disks 91 are provided on a base B, and a head drive circuit and signal processing circuit and input/output interface (none of these are illustrated) are accommodated on the back face of base B. At the outside, there is connected a 32-bit bus line (not shown). On both faces of magnetic disk 91, six integral read/write heads H (the other five are not shown) are arranged. A rotary actuator A for driving read/write head H, its drive and control circuitry, and a spindle direct-coupled motor M for disk rotation are mounted thereon. The diameter of disk 91 was 46 [mm], a region of the disk surface of diameter 10 [mm] to 40 [mm] being employed. An embedded-type servo system was employed, high density being achievable since a servo surface is not provided. This device can be directly connected as the external storage device of a miniature computer (not shown). The input/output interface incorporates a cache memory and the transfer speed corresponds to a bus line in the range of 5 to 20 megabytes per second. A large-capacity magnetic disk apparatus D could also be constructed by connecting a plurality of the present devices, with the provision of an external controller. According to the present invention, oxidation of the magnetoresistance effect device in the heating step of manufacture of the read/write head can be prevented by providing a suitable protective film on the uppermost layer of the magnetoresistance effect device. Consequently, a magnetoresistance effect device, magnetoresistance effect sensor, magnetoresistance detection system, and magnetic storage system can be obtained which are of excellent reliability, since they ensure a sufficient rate of change of resistance, a sufficiently large exchange coupling magnetic field applied from the antiferromagnetic layer to the fixed magnetic layer,..and a sufficiently small coercive force of the free magnetic layer.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

The entire disclosure of Japanese Patent Application No. 9-123797 (Filed on May 14, 1997) including specification, claims, drawings and summary are incorporated herein by reference in its entirety.

TABLE 1

| Antiferromagnetic Layer. Material and Thickness (nm) | Temperature of heat treatment (° C.) | Free Layer (Oe) | MR Ratio (%) | Hex (Oe) |
| --- | --- | --- | --- | --- |
| NiMn 20 | 270 | 0.9 | 2.7 | 590 |
| NiMnCr 20 | 270 | 1.2 | 2.6 | 350 |
| PtMn 18 | 250 | 0.9 | 3.9 | 340 |
| IrMn 17 | 230 | 0.8 | 4.2 | 380 |
| PtPdMn 25 | 230 | 0.7 | 4.3 | 370 |
| RhMn 18 | 230 | 0.7 | 4.1 | 390 |

TABLE 2

| Material ↓ | Thickness (nm) → | | | | | |
| --- | --- | --- | --- | --- | --- | --- |
| | 1.0 | 2.0 | 3.0 | 5.0 | 7.0 | 10.0 |
| Ti | 0.9 | 0.9 | 1.0 | 0.8 | 1.0 | 0.9 |
| | 2.8 | 2.8 | 2.7 | 2.6 | 2.5 | 1.9 |
| | 310 | 450 | 510 | 540 | 570 | 600 |
| V | 1.0 | 1.1 | 0.9 | 0.9 | 1.0 | 1.1 |
| | 2.9 | 2.9 | 2.7 | 2.6 | 2.4 | 1.8 |
| | 300 | 460 | 510 | 520 | 570 | 590 |
| Cr | 1.1 | 1.0 | 0.9 | 0.8 | 1.0 | 1.0 |
| | 2.8 | 2.8 | 2.6 | 2.5 | 2.5 | 1.7 |
| | 290 | 440 | 500 | 530 | 530 | 600 |
| Co | 1.1 | 0.8 | 0.9 | 0.9 | 1.0 | 1.0 |
| | 2.7 | 2.7 | 2.6 | 2.5 | 2.4 | 1.9 |
| | 270 | 460 | 520 | 560 | 570 | 610 |
| Cu | 0.9 | 0.8 | 1.0 | 0.9 | 0.9 | 1.0 |
| | 2.9 | 2.8 | 2.7 | 2.6 | 2.5 | 1.6 |
| | 280 | 450 | 490 | 510 | 550 | 590 |
| Zn | 1.0 | 0.9 | 1.0 | 1.0 | 1.0 | 0.9 |
| | 2.9 | 2.7 | 2.7 | 2.6 | 2.3 | 1.9 |
| | 300 | 420 | 490 | 550 | 580 | 600 |
| Y | 0.8 | 0.9 | 0.8 | 1.0 | 0.9 | 0.9 |
| | 3.1 | 3.0 | 3.0 | 2.7 | 2.6 | 1.8 |
| | 270 | 430 | 500 | 530 | 570 | 590 |
| Zr | 0.9 | 0.9 | 1.0 | 1.0 | 0.9 | 1.0 |
| | 3.0 | 3.0 | 2.8 | 2.6 | 2.5 | 1.6 |
| | 280 | 460 | 510 | 550 | 550 | 580 |

TABLE 3

| Material ↓ | Thickness (nm) → | | | | | |
| --- | --- | --- | --- | --- | --- | --- |
| | 1.0 | 2.0 | 3.0 | 5.0 | 7.0 | 10.0 |
| Nb | 0.8 | 1.0 | 0.9 | 0.9 | 1.0 | 1.1 |
| | 3.1 | 2.9 | 2.7 | 2.6 | 2.3 | 1.5 |
| | 250 | 440 | 500 | 510 | 580 | 590 |

TABLE 3-continued

| Material ↓ | Thickness (nm) → | | | | | |
|---|---|---|---|---|---|---|
| | 1.0 | 2.0 | 3.0 | 5.0 | 7.0 | 10.0 |
| Mo | 1.0 | 1.0 | 0.9 | 1.0 | 0.9 | 1.0 |
| | 2.9 | 2.8 | 2.7 | 2.6 | 2.5 | 1.8 |
| | 270 | 430 | 510 | 520 | 540 | 570 |
| Tc | 0.8 | 0.9 | 0.9 | 1.0 | 1.1 | 0.9 |
| | 3.0 | 2.8 | 2.7 | 2.6 | 2.4 | 1.7 |
| | 260 | 450 | 520 | 550 | 570 | 600 |
| Ru | 1.0 | 1.0 | 1.1 | 0.9 | 1.0 | 0.8 |
| | 2.9 | 2.9 | 2.8 | 2.7 | 2.5 | 1.7 |
| | 260 | 430 | 490 | 550 | 570 | 590 |
| Rh | 0.9 | 1.1 | 0.9 | 1.0 | 1.0 | 0.9 |
| | 2.8 | 2.7 | 2.7 | 2.5 | 2.5 | 1.6 |
| | 280 | 460 | 510 | 550 | 580 | 610 |
| Pd | 1.0 | 1.1 | 1.0 | 1.0 | 0.9 | 0.9 |
| | 3.1 | 3.0 | 2.7 | 2.7 | 2.6 | 1.9 |
| | 270 | 440 | 480 | 520 | 530 | 550 |
| Ag | 0.9 | 0.9 | 1.0 | 1.1 | 0.9 | 1.0 |
| | 3.0 | 2.8 | 2.7 | 2.6 | 2.4 | 1.6 |
| | 2.90 | 450 | 480 | 510 | 540 | 570 |
| Hf | 1.0 | 0.9 | 1.0 | 1.1 | 0.9 | 0.9 |
| | 3.1 | 3.0 | 2.9 | 2.7 | 2.6 | 2.0 |
| | 280 | 470 | 520 | 560 | 570 | 580 |

TABLE 4

| Material ↓ | Thickness (nm) → | | | | | |
|---|---|---|---|---|---|---|
| | 1.0 | 2.0 | 3.0 | 5.0 | 7.0 | 10.0 |
| Ta | 0.9 | 0.8 | 0.8 | 0.9 | 0.9 | 1.0 |
| | 2.9 | 2.9 | 2.8 | 2.7 | 2.6 | 1.8 |
| | 270 | 440 | 490 | 530 | 560 | 600 |
| W | 1.1 | 1.1 | 0.9 | 1.0 | 1.0 | 1.0 |
| | 3.0 | 2.8 | 2.8 | 2.6 | 2.6 | 1.9 |
| | 290 | 450 | 500 | 530 | 550 | 580 |
| Re | 0.9 | 0.9 | 0.9 | 1.0 | 0.9 | 0.9 |
| | 2.8 | 2.8 | 2.7 | 2.6 | 2.4 | 1.5 |
| | 270 | 280 | 360 | 440 | 510 | 550 |
| Os | 1.0 | 0.9 | 1.0 | 0.9 | 0.9 | 1.0 |
| | 2.9 | 2.8 | 2.7 | 2.6 | 2.5 | 1.7 |
| | 260 | 430 | 520 | 540 | 550 | 560 |
| Ir | 0.9 | 0.8 | 0.9 | 1.0 | 0.9 | 0.9 |
| | 3.0 | 3.0 | 2.8 | 2.7 | 2.6 | 1.8 |
| | 270 | 440 | 490 | 530 | 560 | 610 |
| Pt | 0.9 | 1.0 | 0.9 | 0.9 | 1.1 | 0.9 |
| | 3.0. | 3.1 | 2.8 | 2.7 | 2.5 | 1.6 |
| | 310 | 510 | 560 | 570 | 590 | 610 |
| Au | 1.1 | 1.0 | 0.9 | 1.0 | 1.1 | 1.1 |
| | 2.9 | 2.8 | 2.7 | 2.6 | 2.6 | 1.8 |
| | 300 | 490 | 550 | 570 | 610 | 600 |

TABLE 5

| Protective Film | Free Layer (Oe) | MR Ratio (%) | Hex (Oe) |
|---|---|---|---|
| Si Oxide | 1.0 | 3.00 | 520 |
| Si Nitride | 1.0 | 2.90 | 530 |
| Al Oxide | 0.9 | 3.10 | 520 |
| Al Nitride | 0.9 | 3.10 | 540 |
| Ta Oxide | 0.9 | 3.00 | 550 |
| Ti Oxide | 0.9 | 2.90 | 540 |
| Mixture of Si Oxide and Al Oxide | 1.0 | 3.20 | 520 |
| Mixture of Si Nitride and Al Nitride | 0.9 | 3.10 | 530 |
| Mixture of Si Oxide, Si Nitride, Al Oxide and Al Nitride | 0.9 | 3.20 | 510 |

TABLE 6

| Metal Protective Film | Free Layer (Oe) | MR Ratio (%) | Hex (Oe) |
|---|---|---|---|
| Ta | 1.0 | 3.0 | 620 |
| Hf | 0.9 | 3.2 | 650 |
| Zr | 0.9 | 3.1 | 590 |
| W | 1.0 | 3.2 | 620 |
| Cr | 1.1 | 3.0 | 560 |
| Ti | 0.8 | 2.9 | 660 |
| Mo | 0.9 | 3.0 | 570 |
| Pt | 1.0 | 3.1 | 560 |
| Ni | 1.0 | 3.1 | 510 |
| Ir | 0.9 | 3.0 | 610 |
| Cu | 0.9 | 3.0 | 620 |
| Ag | 1.1 | 3.2 | 590 |
| Co | 1.0 | 3.0 | 520 |
| Zn | 1.2 | 3.1 | 530 |
| Ru | 0.9 | 3.0 | 590 |
| Rh | 0.9 | 2.9 | 620 |
| Re | 1.3 | 3.1 | 500 |
| Au | 1.0 | 3.2 | 570 |
| Os | 0.9 | 3.1 | 580 |
| Pd | 0.9 | 3.0 | 580 |
| Nb | 1.0 | 3.1 | 610 |
| V | 1.1 | 3.2 | 650 |
| Y | 0.9 | 3.1 | 640 |

TABLE 7

| Antimetal Protective Film | Free Layer (Oe) | MR Ratio (%) | Hex (Oe) |
|---|---|---|---|
| Si Oxide | 0.9 | 3.10 | 590 |
| Si Nitride | 1.0 | 3.20 | 580 |
| Al Nitride | 1.0 | 3.00 | 620 |
| Al Nitride | 0.9 | 3.10 | 590 |
| Ta Nitride | 0.9 | 3.20 | 620 |
| Ti Nitride | 0.8 | 3.10 | 610 |
| Mixture of Si Oxide and Al Oxide | 1.0 | 3.20 | 600 |
| Mixture of Si Nitride and Al Nitride | 0.9 | 3.00 | 630 |
| Mixture of Si Oxide, Si Nitride, Al Oxide and Al Nitride | 0.9 | 3.10 | 640 |

TABLE 8

| Thickness of Al Oxide Film (nm) | Free Layer (Oe) | MR Ratio (%) | Hex (Oe) |
|---|---|---|---|
| 0 | 1.0 | 2.7 | 270 |
| 10 | 0.9 | 3.0 | 370 |
| 20 | 1.0 | 3.1 | 510 |
| 30 | 0.8 | 3.1 | 590 |
| 40 | 1.0 | 3.3 | 610 |
| 50 | 0.9 | 3.1 | 620 |
| 70 | 0.9 | 3.2 | 610 |
| 100 | 0.8 | 3.2 | 630 |

TABLE 9

| Thickness of Ta Layer (nm) | Free Layer (Oe) | MR Ratio (%) | Hex (Oe) |
|---|---|---|---|
| 0.0 | 0.9 | 3.0 | 520 |
| 0.0 | 0.9 | 3.0 | 520 |
| 0.4 | 1.0 | 3.1 | 570 |
| 1.0 | 0.9 | 3.2 | 610 |
| 2.0 | 0.9 | 3.0 | 630 |
| 3.0 | 0.9 | 3.1 | 620 |

TABLE 9-continued

| Thickness of Ta Layer (nm) | Free Layer (Oe) | MR Ratio (%) | Hex (Oe) |
|---|---|---|---|
| 5.0 | 1.0 | 3.0 | 630 |
| 7.0 | 0.9 | 2.9 | 610 |
| 10.0 | 0.9 | 2.8 | 590 |

TABLE 10

| Antiferromagnetic Layer. Material and Thickness (nm) | Temperature of heat treatment (° C.) | Free Layer (Oe) | MR Ratio (%) | Hex (Oe) |
|---|---|---|---|---|
| NiMn 20 | 270 | 0.9 | 2.7 | 590 |
| NiMnCr 20 | 270 | 1.0 | 2.9 | 580 |
| PtMn 18 | 250 | 0.9 | 3.9 | 610 |
| IrMn 17 | 230 | 0.9 | 4.4 | 590 |
| PtPdMn 25 | 230 | 0.8 | 4.4 | 580 |
| PtPdMn 18 | 230 | 1.0 | 4.2 | 590 |

TABLE 11

| Structure of Film | Free Layer (Oe) | MR Ratio (%) | Hex (Oe) |
|---|---|---|---|
| Structure of FIG. 5 | 0.8 | 3.1 | 590 |
| Structure of FIG. 6 | 1.8 | 5.8 | 550 |
| Structure of FIG. 7 | 0.9 | 2.2 | 610 |
| Structure of FIG. 8 | 2.0 | 4.2 | 530 |
| Structure of FIG. 9 | 1.2 | 2.9 | 570 |
| Structure of FIG. 10 | 2.5 | 5.7 | 540 |
| Structure of FIG. 11 | 1.1 | 2.3 | 580 |
| Structure of FIG. 12 | 2.4 | 4.4 | 510 |

TABLE 12

| Sample No. | 001 | 002 | 003 | 004 | 005 |
|---|---|---|---|---|---|
| Mark Length Which Reproduction Output Decrease to Half (frequency)(kFCI) | 154 | 152 | 153 | 154 | 153 |
| Reproduction Output (peak to peak)(mV) | 1.6 | 1.7 | 1.5 | 1.7 | 1.7 |
| Noise | No | No | No | No | No |
| Symmetricity of Wave shape | Good | Good | Good | Good | Good |
| S/N (dB) | 27.0 | 27.1 | 27.3 | 27.4 | 27.2 |
| Error Rate | $10^{-6}$ or less | $10^{-6}$ or less | $10^{-6}$ or less | $10^{-6}$ or less | $10^{-6}$ or less |
| 80° C. 500Oe 2500 Hours Change of Error Rate after Atmospheric Test | No | No | No | No | No |
| Current Density $2X \times 10^7$ A/cm² Conducting Test at 80 Degree Change of Resistance and Resistive Change Ratio until 1000 hours | No | No | No | No | No |

TABLE 13

| Sample No. | 006 | 007 | 008 | 009 | 010 |
|---|---|---|---|---|---|
| Mark Length Which Reproduction Output Decrease to Half (frequency)(kFCI) | 154 | 154 | 155 | 154 | 156 |
| Reproduction Output (peak to peak)(mV) | 1.7 | 1.6 | 1.7 | 1.3 | 1.4 |
| Noise | No | No | No | No | No |
| Symmetricity of Wave shape | Good | Good | Good | Good | Good |
| S/N (dB) | 27.2 | 27.1 | 27.2 | 26.3 | 26.4 |
| Error Rate | $10^{-6}$ or less | $10^{-6}$ or less | $10^{-6}$ or less | $10^{-6}$ or less | $10^{-6}$ or less |
| 80° C. 500Oe 2500 Hours Change of Error Rate after Atmospheric Test | No | No | No | No | No |
| Current Density $2X \times 10^7$ A/cm² Conducting Test at 80 Degree Change of Resistance and Resistive Change Ratio until 1000 hours | No | No | No | No | No |

TABLE 14

| Sample No. | 011 | 012 | 013 | 014 | 015 |
|---|---|---|---|---|---|
| Mark Length Which Reproduction Output Decrease to Half (frequency)(kFCI) | 157 | 155 | 154 | 155 | 156 |
| Reproduction Output (peak to peak)(mV) | 1.3 | 1.4 | 1.5 | 1.3 | 1.4 |
| Noise | No | No | No | No | No |
| Symmetricity of Wave shape | Good | Good | Good | Good | Good |
| S/N (dB) | 26.5 | 26.1 | 26.3 | 26.2 | 26.3 |
| Error Rate | $10^{-6}$ or less | $10^{-6}$ or less | $10^{-6}$ or less | $10^{-6}$ or less | $10^{-6}$ or less |
| 80° C. 500Oe 2500 Hours Change of Error Rate after Atmospheric Test | No | No | No | No | No |
| Current Density $2X \times 10^7$ A/cm² Conducting Test at 80 Degree Change of Resistance and Resistive Change Ratio until 1000 hours | No | No | No | No | No |

TABLE 15

| Sample No. | First Protective Film | Second Protective Film |
|---|---|---|
| 001 | Ta (3 nm) | Al Oxide (50 nm) |
| 002 | Cu (2 nm) | Al Oxide (50 nm) |
| 003 | Ta (3 nm) | Mixture of Al Oxide and Si Oxide (50 nm) |
| 004 | Ta (3 nm) | Si Nitride (50 nm) |
| 005 | Hf (3 nm) | Al Oxide (50 nm) |
| 006 | Zr (3 nm) | Al Oxide (50 nm) |
| 007 | W (3 nm) | Al Oxide (50 nm) |
| 008 | Y (3 nm) | Al Oxide (50 nm) |
| 009 | No | Al Oxide (50 nm) |
| 010 | No | Si Nitride (50 nm) |
| 011 | No | Ta (3nm) |
| 012 | No | Zr (3nm) |
| 013 | No | Hf (3nm) |
| 014 | No | Au (3nm) |
| 015 | No | Pt (3nm) |

TABLE 16

| Sample No. | 001 | 002 | 003 | 004 | 005 |
|---|---|---|---|---|---|
| Mark Length Which Reproduction Output Decrease to Half (frequency)(kFCI) | 156 | 154 | 154 | 152 | 153 |
| Reproduction Output (peak to peak)(mV) | 1.7 | 1.6 | 1.5 | 1.6 | 1.5 |
| Noise | No | No | No | No | No |
| Symmetricity of Wave shape | Good | Good | Good | Good | Good |
| S/N (dB) | 26.8 | 26.9 | 26.8 | 26.7 | 26.9 |
| Error Rate | $10^{-6}$ or less | $10^{-6}$ or less | $10^{-6}$ or less | $10^{-6}$ or less | $10^{-6}$ or less |
| 80° C. 5000e 2500 Hours Change of Error Rate after Atmospheric Test | No | No | No | No | No |
| Current Density $2X \times 10^7$ A/cm² Conducting Test at 80 Degree Change of Resistance and Resistive Change Ratio until 1000 hours | No | No | No | No | No |

TABLE 17

| Sample No. | 006 | 007 | 008 | 009 | 010 |
|---|---|---|---|---|---|
| Mark Length Which Reproduction Output Decrease to Half (frequency)(kFCI) | 154 | 156 | 157 | 155 | 157 |
| Reproduction Output (peak to peak)(mV) | 1.8 | 1.7 | 1.6 | 1.2 | 1.1 |
| Noise | No | No | No | No | No |
| Symmetricity of Wave shape | Good | Good | Good | Good | Good |
| S/N (dB) | 26.9 | 26.9 | 27.0 | 26.4 | 26.2 |
| Error Rate | $10^{-6}$ or less | $10^{-6}$ or less | $10^{-6}$ or less | $10^{-6}$ or less | $10^{-6}$ or less |
| 80° C. 5000e 2500 Hours Change of Error Rate after Atmospheric Test | No | No | No | No | No |
| Current Density $2X \times 10^7$ A/cm² Conducting Test at 80 Degree Change of Resistance and Resistive Change Ratio until 1000 hours | No | No | No | No | No |

TABLE 18

| Sample No. | 011 | 012 | 013 | 014 | 015 |
|---|---|---|---|---|---|
| Mark Length Which Reproduction Output Decrease to Half (frequency)(kFCI) | 157 | 155 | 152 | 157 | 153 |
| Reproduction Output (peak to peak)(mV) | 1.2 | 1.3 | 1.4 | 1.3 | 1.3 |
| Noise | No | No | No | No | No |
| Symmetricity of Wave shape | Good | Good | Good | Good | Good |
| S/N (dB) | 26.5 | 26.3 | 26.4 | 26.2 | 26.3 |
| Error Rate | $10^{-6}$ or less | $10^{-6}$ or less | $10^{-6}$ or less | $10^{-6}$ or less | $10^{-6}$ or less |
| 80° C. 5000e 2500 Hours Change of Error Rate after Atmospheric Test | No | No | No | No | No |
| Current Density $2X \times 10^7$ A/cm² Conducting Test at 80 Degree Change of Resistance and Resistive Change Ratio until 1000 hours | No | No | No | No | No |

What is claimed is:

1. A shielded magnetoresistance (MR) effect sensor, comprising:
   a lower shielding layer laminated on a substrate;
   a lower gap layer laminated on said lower shielding layer;
   a MR effect device laminated on said lower gap layer, said MR effect device having a top surface and side surfaces and a protective layer 2–7 nm thick;
   a vertical bias layer laminated on said lower gap layer and directly contacting said side surfaces of said MR effect device;
   a lower electrode layer laminated on said vertical bias layer and directly contacting said side surfaces of said MR effect device;
   an upper gap layer laminated on said lower electrode layer and on said top surface of said MR effect device; and
   an upper shielding layer laminated on said upper gap layer.

2. A MR detection system comprising:
   the MR effect sensor comprising,
      a lower shielding layer laminated on a substrate,
      a lower gap layer laminated on said lower shielding layer,
      a MR effect device laminated on said lower gap layer, said MR effect device having a top surface and side surfaces and a protective layer 2–7 nm thick,
      a vertical bias layer laminated on said lower gap layer and directly contacting said side surfaces of said MR effect device,
      a lower electrode layer laminated on said vertical bias layer and directly contacting said side surfaces of said MR effect device,
      an upper gap layer laminated on said lower electrode layer and on said top surface of said MR effect device, and
      an upper shielding layer laminated on said upper gap layer; and
   a resistance detector that detects a change in resistivity of said MR effect device.

3. A magnetic storage system comprising:
   a read/write head that comprises,
      a lower shielding layer laminated on a substrate,
      a lower gap layer laminated on said lower shielding layer,
      a MR effect device laminated on said lower gap layer, said MR effect device having a top surface and side surfaces and a protective layer 2–7 nm thick,
      a vertical bias layer laminated on said lower gap layer and directly contacting said side surfaces of said MR effect device,
      a lower electrode layer laminated on said vertical bias layer and directly contacting said side surfaces of said MR effect device,
      an upper gap layer laminated on said lower electrode layer and on said top surface of said MR effect device, an upper shielding layer laminated on said upper gap layer, and a recording head for recording magnetic data onto a recording medium;

a resistance detector that detects a change in resistivity of said MR effect device;

the magnetic recording medium having a plurality of tracks for recording magnetic data; and an actuator for traversing said read/write head to a prescribed one of said tracks.

4. A shielded magnetoresistance (MR) effect sensor, comprising:

a lower shielding layer laminated on a substrate;

a lower gap layer laminated on said lower shielding layer;

a MR effect device laminated on said lower gap layer, said MR effect device having a top surface and side surfaces and a protective layer 2–7 nm thick;

a vertical bias layer laminated on said lower gap layer and directly contacting a portion of said top surface of said MR effect device and said side surfaces of said MR effect device;

a lower electrode layer laminated on said vertical bias layer;

an upper gap layer laminated on said lower electrode layer and on a further portion of said top surface of said MR effect device; and an upper shielding layer laminated on said upper gap layer.

5. A MR detection system comprising:

the MR effect sensor comprising, a lower shielding layer laminated on a substrate, a lower gap layer laminated on said lower shielding layer, a MR effect device laminated on said lower gap layer, said MR effect device having a top surface and side surfaces and a protective layer 2–7 nm thick, a vertical bias layer laminated on said lower gap layer and directly contacting a portion of said top surface of said MR effect device and said side surfaces of said MR effect device, a lower electrode layer laminated on said vertical bias layer, an upper gap layer laminated on said lower electrode layer and on a further portion of said top surface of said MR effect device, and an upper shielding layer laminated on said upper gap layer; and a resistance detector that detects a change in resistivity of said MR effect device.

6. A magnetic storage system comprising:

a read/write head that comprises, a lower shielding layer laminated on a substrate, a lower gap layer laminated on said lower shielding layer, a MR effect device laminated on said lower gap layer, said MR effect device having a top surface and side surfaces and a protective layer 2–7 nm thick, a vertical bias layer laminated on said lower gap layer and directly contacting a portion of said top surface of said MR effect device and said side surfaces of said MR effect device, a lower electrode layer laminated on said vertical bias layer, an upper gap layer laminated on said lower electrode layer and on a further portion of said top surface of said MR effect device, an upper shielding layer laminated on said upper gap layer, and a recording head for recording magnetic data onto a recording medium;

a resistance detector that detects a change in resistivity of said MR effect device;

the magnetic recording medium having a plurality of tracks for recording magnetic data; and an actuator for traversing said read/write head to a prescribed one of said tracks.

* * * * *